United States Patent [19]

Asai et al.

[11] 3,771,026

[45] Nov. 6, 1973

[54] CONDUCTIVE REGION FOR SEMICONDUCTOR DEVICE AND METHOD FOR MAKING THE SAME

[75] Inventors: Shojiro Asai; Eiichi Maruyama, both of Tokyo, Japan

[73] Assignee: Hitachi, Ltd., Tokyo, Japan

[22] Filed: Mar. 25, 1971

[21] Appl. No.: 128,069

[30] Foreign Application Priority Data

Mar. 25, 1970 Japan ................................ 45/24405

[52] U.S. Cl. .. 317/234 R, 317/234 N, 317/235 AT, 17/235

[51] Int. Cl. ................................................ H01l 7/00

[58] Field of Search ...................................... 317/235

[56] References Cited

UNITED STATES PATENTS 3,634,927 1/1972 Neale et al ........................... 29/576

3,585,088 6/1971 Schwuttke et al. ................. 148/174

*Primary Examiner*—John W. Huckert

*Assistant Examiner*—E. Wojciechowicz

*Attorney*—Craig & Antonelli

[57] ABSTRACT

Two portions of a semiconductor body are connected with each other by way of transformed regions, transformed into the crystalline state in parts corresponding to the two portions respectively of a first amorphous semiconductor, and by way of a further transformed region transformed into the crystalline state, in a second amorphous semiconductor layer formed on the first amorphous semicondcutor layer.

4 Claims, 9 Drawing Figures

PRIOR ART

INVENTOR.
SHOJIRO ASAI and
EIICHI MARUYAMA
BY Craig, Antonelli, Stewart & Hill
ATTORNEYS

CONDUCTIVE REGION FOR SEMICONDUCTOR DEVICE AND METHOD FOR MAKING THE SAME

This invention relates to conductive regions such as wirings and electrodes for a semiconductor device and to a method for making the same and, more particularly, to conductive regions for a semiconductor integrated circuit device and to a method for making the same.

Hereafter in this application, wirings are mainly described as conductive regions.

In the art of integrated circuit devices, it is imporant that wirings be established between predetermined portions on a semiconductor body.

A conventional semiconductor device, having wirings established between predetermined portions on a semiconductor body, comprises a semiconductor body having semiconductor circuit elements therein, a thin layer of insulator, such as $SiO_2$ and $Al_2O_3$ on the semiconductor body, the thin layer being etched at portions corresponding to predetermined portions of the semiconductor body to expose the surface of the semiconductor body, and a conductive layer of Al or Cr formed on the thin layer and between the predetermined portions so as to interconnect the predetermined portions with the conductive layer, that is, wirings.

Recently, multi-layer wirings have been introduced into semiconductor devices, since it is necessary for semiconductor integrated circuit devices to increase the density of integration in the devices.

Multi-layer wirings are composed of a thin layer of $SiO_2$ or $Al_2O_3$ on the aforementioned wirings, the thin layer being etched in portions corresponding to predetermined portions of the wirings and/or of the semiconductor body to expose the surface of the wirings and/or of the semiconductor body, and of a conductive layer of Al or Cr formed on the thin layer and/or on the semiconductor body and between the predetermined portions so as to connect the predetermined portions by means of the conductive layer.

As mentioned above, the multi-layer wirings are formed by mutually laminating conductive layers and thin layers of insulating material and by connections between the predetermined portions with the conductive layers.

These conventional wirings, however, have certain defects and entail certain drawbacks caused by using etched holes for the connection between the predetermined portions, that is, the defects of a short-circuit between wirings, a snapping of wirings, and a decrease of production yield caused thereby.

It is, therefore, an object of this invention to eliminate the above-mentioned defects of the prior art wirings.

It is another object of this invention to provide conductive regions whose surface is plane to the tin layer and a method for making the conductive regions.

It is a further object of this invention to provide a method for making the conductive regions in a simple manner.

These and other objects and advantages of the presen invention will become apparent to those skilled in the art from a consideration of the following specification and claims, taken in conjunction with the accompanying drawings, in which:

Figure 1:
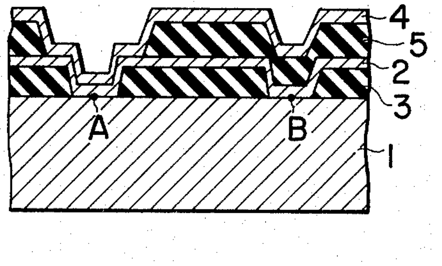
FIG. 1 PRIOR ART
FIGS. 1 through 3 are sectional views for explaining conventional wirings of a semiconductor device.
Figure 2:
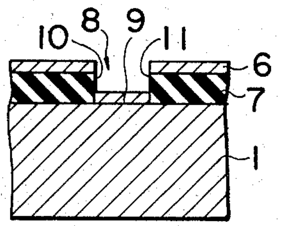
FIG. 2 PRIOR ART
Figure 3:
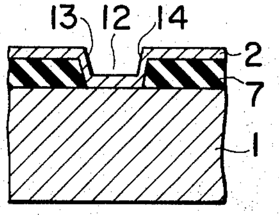
FIG. 3 PRIOR ART

Referring now to FIGS. 1 through 3 to explain conventional wirings, as mentioned before, multi-layer wirings are utilized for a semiconductor integrated circuit device to increase the density of integration in the device.

FIG. 1 is a sectional view of a conventional multilayer wiring which comprises a semiconductor body 1, a first insulating layer 3, a first conductive layer 2, a second insulating layer 5, and a second conductive layer 4. In the predetermined portions of each insulating layer, holes are opened to enable connections between predetermined portions by means of the conductive layers 2 and 4.

For example, in FIG. 1, the predetermined portions of the insulating layer 3, which corresponds to the points A and B of the semiconductor body 1, are etched away to expose the surface portions A and B of the semiconductor body 1. The points A and B are connected to each other by the first conductive layer 2 formed on the first insulating layer 3 and on the exposed surface of the semiconductor body 1. The second conductive layer 4 is for connecting the point A and other points (not shown), and is isolated from the first conductive layer 2 by the second insulating layer 5 except at a point corresponding to the point A and to the other points. The prior art multi-wirings are constructed in the following manner.

The conventional multi-wirings of FIG. 1 are formed by the steps of preparing the semiconductor body 1 having the desired semiconductor integrated circuit elements therein (not shown), forming the first insulating layer 3 on the semiconductor body 1, etching the portions corresponding to the points A and B so as to expose the surface of the semiconductor body 1 corresponding to the points A and B, evaporating the conductive material such as A1 on the first insulating layer 3 and on the exposed surfaces of the semiconductor body 1 for forming the first conductive layer 2, forming the second insulating layer 5 on the first conductive layer 2, etching away the portion of the second insulating layer 5 corresponding to the point A to expose the surface of the first conductive layer 2 corresponding to the point A, and forming the second conductive layer 4 on the second insulating layer 5 and on the exposed surface of the first conductive layer 2.

In this prior art method, however, as shown in FIG. 2 where the side walls 10 and 11 of a hole 8 formed in the insulating layer 7 are perpendicular to the surface of the semiconductor body 1, a conductive layer 6 is formed on the surfaces of the upper portion of the insulating layer 7 and of the bottom portion 9 of the hole 8, but is formed at best only very slightly on the side walls 10 and 11 of the hole 8, so that the object of the desired wiring can not be accomplished or becomes imperfect.

To avoid such imperfection in the conventional semiconductor device, the side walls of any etched holes are made so as to be off from the perpendicularity to the surface of the semiconductor body 1 as shown in FIG. 3. Therefore, a conductive layer 2 is formed also on the side walls 13 and 14 in the hole 12, whereby the wirings are accomplished.

In this prior art device of FIG. 3, however, the thickness of the conductive layer 2 on the side walls 13 and 14 is not sufficient, whence this wiring is liable to break or snap and to become poor in conduction along the portions corresponding to the walls 13 and 14.

Moreover, since the rate of heat expansion of an $SiO_2$ layer and that of an Al layer utilized in the semiconductor device as mentioned above are different from each other, distortions and cracks are caused in the device, namely, in the $SiO_2$ layers and Al layers during the operation of the device. These warpings, distortions and cracks become the causes of lowering the moisture-proof characteristics of the device and of snapping the wirings with the result of possible ultimate failure of the device.

This invention is based on the characteristics of an amorphous semiconductor, that is, the amorphous semiconductor shows high conductivity when transformed into the crystalline state.

It is well known that a mixture of materials selected from the group essentially consisting of Se, As, Te, Si and Ge, etc., shows the characteristics of an amorphous semiconductor when the mixture is melted under high temperature and after that cooled rapidly. The electrical resistance of the amorphous semiconductor is more than $10^8\Omega$cm, practically is of the insulator type. Also, it is well known that the amorphous semiconductor is transformed into the crystalline state when electric energy, radiation energy, and/or thermal energy are applied to the amorphous semiconductor whereby the transformed amporphous semiconductor possesses a relatively low electrical resistance of about $10^{-4}$ to about $10^{-3}\Omega$cm, and is practically usable as a conductor. Moreover, the crystalline state of the amorphous semiconductor is maintained except when a pulse having high energy is supplied thereto.

The gist of this invention is to utilize the amorphous semiconductor layer as an insulating layer and the crystalline state of the amorphous semiconductor layer as a conductive layer.

Figure 4:
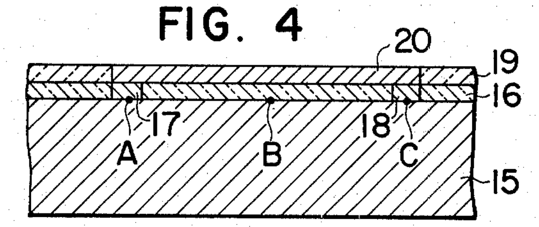
FIG. 4 is a sectional view illustrating an embodiment of this invention.

FIG. 4 is an embodiment of this invention, in which reference numeral 15 indicates a semiconductor body such as Si having conventional semiconductor integrated circuit elements therein (not shown), reference numeral 16 indicates a first amorphous semiconductor layer formed on the surface of the semiconductor body 15 and reference numeral 19 indicates a second amorphous semiconductor layer formed on the surface of the first amorphous semiconductor layer 16. Points A and C are connected to each other above a point B by way of a transformed amorphous semiconductor transformed into the crystalline state, that is, reference numerals 17 and 18 in the first amorphous semiconductor layer 16, and reference numeral 20 in the second amorphous semiconductor layer 19 designate in FIG. 4 the transformed amorphous semiconductor regions.

It is understood that when the points A and C are to be connected so as not to extend above the point B, the first amorphous semiconductor layer 16 can be eliminated.

The wiring shown in FIG. 4 is fabricated by the steps of preparing the semiconductor body 15 having semiconductor circuit elements therein, forming the first amorphous semiconductor layer 16 on the semiconductor body 15, transforming the predetermined portions 17 and 18 of the first amorphous semiconductor layer 16 into the crystalline state, forming the second amorphous semiconductor layer 19 on the first amorphous semiconductor layer 16 and on the amorphous semiconductor layers 17 and 18 of crystalline state, and transforming the predetermined portion 20 of the second amorphous semiconductor layer 19 into the crystalline state so as to connect thereby several of the predetermined portions.

Figure 5:
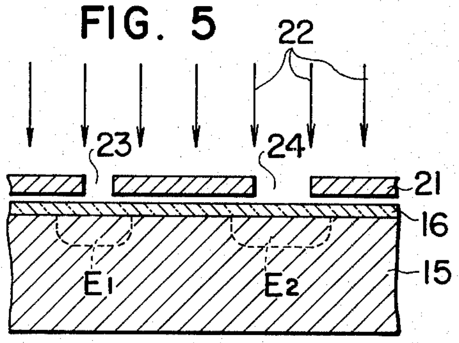
FIGS. 5 and 6 are sectional views for explaining the wiring shown in FIG. 4.
Figure 6:
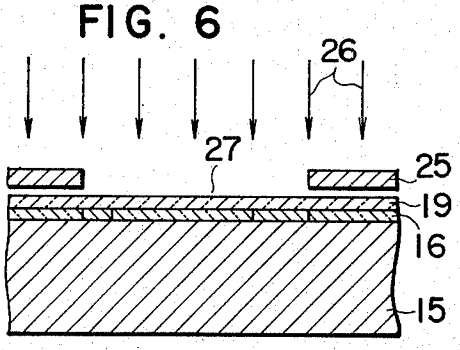

FIGS. 5 and 6 are explanatory of one embodiment of the method for fabricating the wiring shown in FIG. 4.

A mixture of 40 atomic % As - 50 atomic % Te - 10 atomic % Ge as a first amorphous semiconductor layer 16 is formed on a semiconductor body 15 having therein semiconductor circuit elements $E_1$ and $E_2$ to be connected to each other. Predetermined portions corresponding to the circuit elements of the first amorphous semiconductor layer 16 are transformed into the crystalline state by utilizing a mask 21 and by applying a laser beam 22 through the holes 23 and 24 of the mask 21 to the predetermined portions. For transforming the amorphous semiconductor layer 16 into the crystalline state, a $CO_2$ laser beam having an output of 10 W is applied for 5 seconds. By this irradiation with the laser beam, the electrical resistance of the amorphous semiconductor layer 16 is lowered from $10^8\Omega$cm to $10^{-3}\Omega$cm.

After that, a second amorphous semiconductor layer 19 is formed on the first amorphous semiconductor layer 16 and on the amorphous semiconductor layer of crystalline state, as shown in FIG. 6. A $CO_2$ laser beam 26 is applied to the predetrmined portion of the second amorphous semiconductor layer 19 through the hole 27 of a mask 25 to transform the predetermined portion of the second amorphous semiconductor layer 19 into the crystalline state. By this process, the semiconductor circuit elements $E_1$ and $E_2$ are connected to each other through the amorphous semiconductor layers of crystalline state.

In the above process, though the amorphous semiconductor is transformed into the crystalline state by utilizing a laser beam, another energy source, such an electron beam, an electric voltage, etc., can be used for transforming the amorphous semiconductor into the crystalline state. Also, though the masks are utilized for applying the laser beam locally, the masks can be eliminated since a laser beam as also an electron beam, can be easily deflected by utilizing conventional deflection means.

Figure 7:
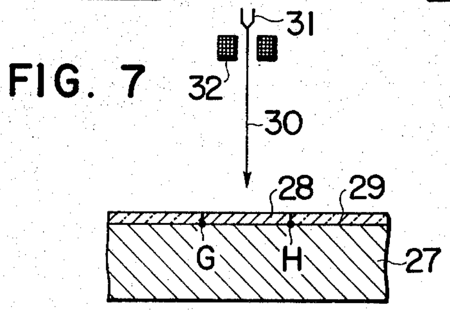
FIG. 7 is a schematic diagram illustrating a method for fabricating a wiring according to this invention.

FIG. 7 is another embodiment for forming a wiring by an amorphous semiconductor of crystalline state.

Points G and H in a semiconductor body 27 are connected to each other by way of an amorphous semiconductor 28 in the crystalline state.

This device is formed by the steps of forming an amorphous semiconductor layer 29 of a mixture of 40 atomic % As - 40 atomic % Te - 15 atomic % Ge - 5 atomic % Si, and deflecting an electron beam 30 from an electron gun 31 onto the amorphous semiconductor layer 29 and between the points G and H. The electron beam 30 is generated by an accelerating voltage of 100 KV and an electric current of 10 $\mu$ A. The amorphous semiconductor layer can be transformed into the crystalline state by applying the electron beam having such energy for 1 milli-second. It is well known that the electron beam 30 can be controlled accurately and easily. Therefore, the region of crystalline state can be formed accurately.

Figure 8:
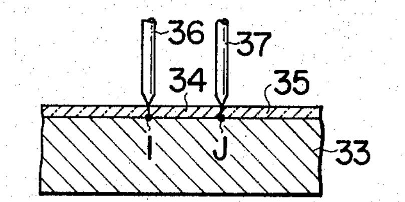
FIG. 8 is a schematic diagram illustrating another embodiment for explaining a method for fabricating a wiring according to this invention.

FIG. 8 is another embodiment for forming a wiring by an amorphous semiconductor of crystalline state.

Points I and J in a semiconductor body 33 are connected to each other by way of an amorphous semiconductor 34 in the crystalline state.

The amorphous semiconductor of the crystalline state 34 is formed by supplying a voltage above the threshold voltage, for switching from the amorphous state to the crystalline state, which is determined by the material of the amorphous semiconductor, and then applying several voltages and electric currents for fixing the crystalline state.

The threshold voltage and the voltage and electric current for fixing the crystalline state are, for example, 260 V, 7 V and 0.2 mA, respectively, where the material of amorphous semiconductor is 30 atomic % Te - 50 atomic % As - 20 atomic % Ge, whose thickness is 500 $\mu$; 12 V, 6 V and 20 mA, respectively, where the material is 50 atomic % Te - 30 atomic % As - 10 atomic % Si - 20 atomic % Ge, whose thickness is 0.8 $\mu$; and 6 V, 1 V and 10 mA, respectively, where the material is 43 atomic % Te - 53 atomic % As - 4 atomic % I, whose thickness is 15 $\mu$. Other typical value can be readily determined empirically, if necessary.

Figure 9:
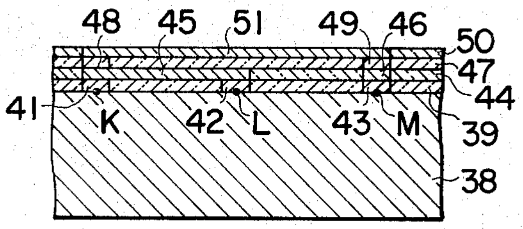
FIG. 9 is a sectional view for explaining another embodiment of this invention.

FIG. 9 is a sectional view of another embodiment of this invention.

The wirings of FIG. 9 are for the purpose of connecting between points K and L, and between points K and M above the point L, which comprise a first amorphous semiconductor layer 39 formed on a semiconductor body 38, whose predetermined portions 41, 42 and 43 corresponding to the points K, L and M are transformed into the crystalline state, a second amorphous semiconductor layer 44 formed on the first amorphous semiconductor layer 39, whose predetermined portions 45 and 46 are transformed into the crystalline state, a third amorphous semiconductor layer 47 formed on the second amorphous semiconductor layer 44, whose predetermined portions 48 and 49 are transformed into the crystalline state, and a fourth amorphous semiconductor layer 50, whose predetermined portion 51 is transformed into the crystalline state. Accordingly, the point K is connected with point L through the portions 41, 45 and 42, and with point M through the points 41, a part of 45, 48, 51, 49, 46 and 43.

The device of FIG. 9 is fabricated by radiation with a laser beam and/or an electron beam and/or by applying voltages and electric current as described above.

This invention further provides a singular effect by using the characteristics of the amorphous semiconductor, that is, the once transformed crystalline state can be transformed back into the amorphous state.

As is well known, the transformed crystalline state is transformed into the amorphous state when it is melted by applying thereto a high energy pulse of a laser beam, of an electron beam and/or electric current, and is cooled quickly. Therefore, where wirings are desired to be changed, the high energy pulse of a laser beam, an electron beam and/or an electric current is/are applied to the wirings to be changed and then the thus heated wirings are cooled quickly. By such process, the wirings to be change are transformed into high resistivity portion, that is, into the amorphous state.

Accordingly, new wirings can be formed instead of the existing wirings to be changed by the process of applying a laser beam, an electron beam, and/or voltages and electric currents. For example, the wiring shown in FIGS. 7 and 8 can be readily changed into the wiring shown in FIG. 4 by applying the high energy pulse of a laser beam, an electron beam, and/or of an electric current and then applying a laser beam, an electron beam, and/or voltages and electric currents to portions of the amorphous semiconductor layer corresponding to the portions I and J, or G and H, that is, the points A and C in FIG. 4, and forming the amorphous semiconductor layer 19 and the crystalline state region 20 by utilizing the steps described above.

The energy of the pulse and the cooling rate are decided by the material of the amorphous semiconductor. For example, when the amorphous semiconductor material is 30 atomic % Te - 50 atomic % As - 20 atomic % Ge of 500 $\mu$ in thickness, an electric pulse of over 10 V and 20 mA ~ 200 mA with 1 micro-second - 1 nano-second in pulse width is used; when the material is 50 atomic % Te - 30 atomic % As - 10 atomic % Si - 20 atomic % Ge of 0.8 $\mu$ in thickness, an electric pulse of over 7 V and 200 mA with 1 micro-second - 1 nano-second is used; and when the material is 43 atomic % Te - 53 atomic % As - 4 atomic % I of 15 $\mu$ in thickness, an electric pulse of over 3 V and 150 mA with 1 micro-second - 1 nano-second is used. The cooling rate is desirable between 1,000° C/sec. and 10°C/sec. It is, however, sufficient to cool the melted amorphous semiconductor with the cooling rate mentioned above only when the melted amorphous semiconductor becomes solid.

As described above, since this invention resides in conductive regions formed by utilizing the singular characteristics of the amorphous semiconductor, the surface of the conductive regions are plane. Accordingly, a short-circuit between wirings and a snapping or breaking off of wirings, as takes place in the conventional wirings can be eliminated. Moreover, since the process for forming and changing wirings of this invention is simple, the yield of the device increases.

While we have shown and described several embodiments in accordance with the present invention, it is understood that the same is not limited thereto, but is susceptible of numerous changes and modifications as known to those skilled in the art, and we therefore do not wish to be limited to the details shown and described herein, but intend to cover all such changes and modifications as are encompassed by the scope of the appended claims.

We claim:

1. A conductive region for a semiconductor device, comprising a first amorphous semiconductor layer disposed on a semiconductor body having semiconductor circuit elements therein, crystalline state regions of the amorphous semiconductor disposed in the first amorphous semiconductor layer corresponding to predetermined portions of the semiconductor body, and a second amorphous semiconductor layer disposed on the first amorphous semicondcutor layer, crystalline state regions of the amorphous semiconductor disposed between several crystalline regions of the amorphous semiconductor in the first amorphous semiconductor layer, within the second amorphous semiconductor layer.

2. A conductive arrangement for a semiconductor device, comprising:

a first substantially planar semiconductor layer disposed on the entire substantially planar surface of a semiconductor body having semiconductor circuit elements therein, said surface defining an area within which discrete portions of said semiconductor body are to be electrically connected together, said first semiconductor layer having an amorphous portion and a plurality of cyrstalline portions, contiguous with said amorphous portion, and prescribed ones of said crystalline portions contacting corresponding ones of said discrete portions of said semiconductor body; and a second semiconductor layer disposed on said first semiconductor layer, said second semiconductor layer having an amorphous portion and at least one crystalline portion contiguous therewith, said at least one crystalline portion extending between and contacting at least two of said prescribed ones of the crystalline portions of said first layer, whereby the corresponding discrete portions of said semiconductor body contacted by said two prescribed crystalline portions of said first layer are connected electrically connected through said two prescribed crystalline portions of said first layer and said at least one crystalline portion of said second layer.

3. A conductive arrangement according to claim 2, wherein said second semiconductor layer is a substantially planar layer and further comprising a third semiconductor layer disposed on said second semiconductor layer, said third semiconductor layer having an amorphous portion and a plurality of crystalline portions, contiguous with said amorphous portion, with at least one selected one of the crystalline portions of said third layer contacting at least one crystalline portion of said second layer.

4. A conductive arrangement according to claim 3, wherein said third layer is a substantially planar layer and further comprising a fourth semiconductor layer disposed on said third semiconductor layer, said fourth semiconductor layer having an amorphous portion and at least one crystalline portion contiguous therewith, said at least one crystalline portion of said fourth layer extending between a pair of crystalline portions in said third layer which are electrically connected through respective crystalline portions of said second and first layers to discrete regions of said semiconductor body.

* * * * *